United States Patent [19]

Uhl et al.

[11] Patent Number: 5,079,472
[45] Date of Patent: Jan. 7, 1992

[54] PIEZOELECTRIC BENDING TRANSDUCER AND THE USE THEREOF

[75] Inventors: Thomas Uhl, Selb, Fed. Rep. of Germany; Herbert Frisch, Wien, Austria

[73] Assignees: Hoechst CeramTec Aktiengesellschaft, Selb, Fed. Rep. of Germany; Hoerbiger Fluidtechnik KG, Wien, Austria

[21] Appl. No.: 541,901

[22] Filed: Jun. 22, 1990

[30] Foreign Application Priority Data

Jun. 22, 1989 [DE] Fed. Rep. of Germany ....... 3920368
Oct. 25, 1989 [DE] Fed. Rep. of Germany ....... 3935474

[51] Int. Cl.⁵ ............................................ H01L 41/08
[52] U.S. Cl. ..................................... 310/332; 310/330
[58] Field of Search ................................. 310/330, 332

[56] References Cited

U.S. PATENT DOCUMENTS

| | | | |
|---|---|---|---|
| 3,152,012 | 10/1964 | Avery | 137/625.4 |
| 4,237,399 | 12/1980 | Sakamoto | 310/317 |
| 4,340,083 | 7/1982 | Cummins | 137/499 |
| 4,492,360 | 1/1985 | Lee et al. | 310/330 |
| 4,545,561 | 10/1986 | Brown | 251/129.08 |
| 4,567,394 | 1/1986 | Frisch | 310/330 |
| 4,610,426 | 9/1986 | Brandner | 310/332 |
| 4,629,926 | 12/1986 | Siegal | 310/330 |
| 4,959,581 | 9/1990 | Dantlgraber | 310/330 |

FOREIGN PATENT DOCUMENTS

| | | | |
|---|---|---|---|
| 0043456 | 1/1982 | European Pat. Off. | |
| 3400645 | 7/1984 | Fed. Rep. of Germany | |
| 3608550 | 9/1987 | Fed. Rep. of Germany | |
| 0146989 | 11/1980 | Japan | 310/332 |
| 0186380 | 10/1984 | Japan | 310/332 |
| 0062170 | 4/1985 | Japan | 310/332 |
| 0023373 | 1/1986 | Japan | 30/332 |
| 8607929 | 12/1986 | PCT Int'l Appl. | 310/330 |

Primary Examiner—Mark O. Budd
Assistant Examiner—Thomas M. Dougherty
Attorney, Agent, or Firm—Foley & Lardner

[57] ABSTRACT

A piezoelectric bending transducer is described which is suitable for installation in a valve channel. It is composed of at least one ceramic layer which is metalized on both sides and has piezoelectric properties and which is polarized such that on application of a voltage it undergoes a change in length, and of at least one rigid molding which is joined to the whole surface thereof and has approximately the same surface dimensions and which on application of a voltage does not undergo an elongation or undergoes an opposite elongation. The piezoceramic layer contains an unmetallized area which has a roughness $R_a$ of less the 0.5 μm and covers an orifice in the valve channel.

21 Claims, 3 Drawing Sheets

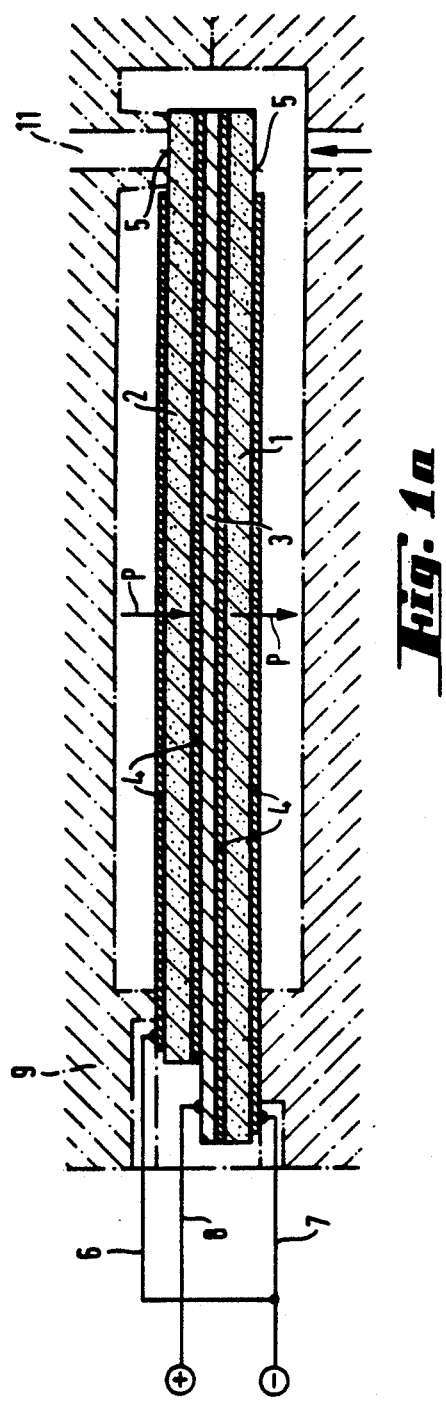
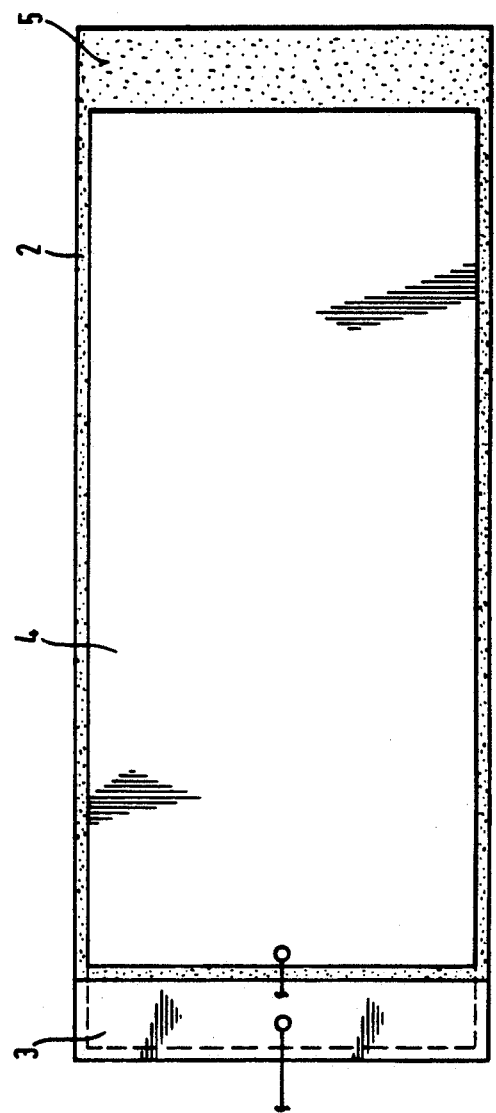

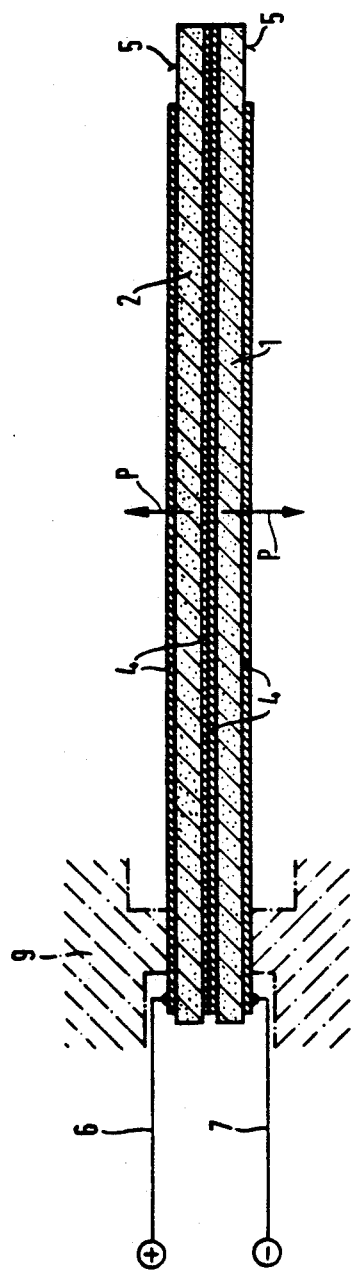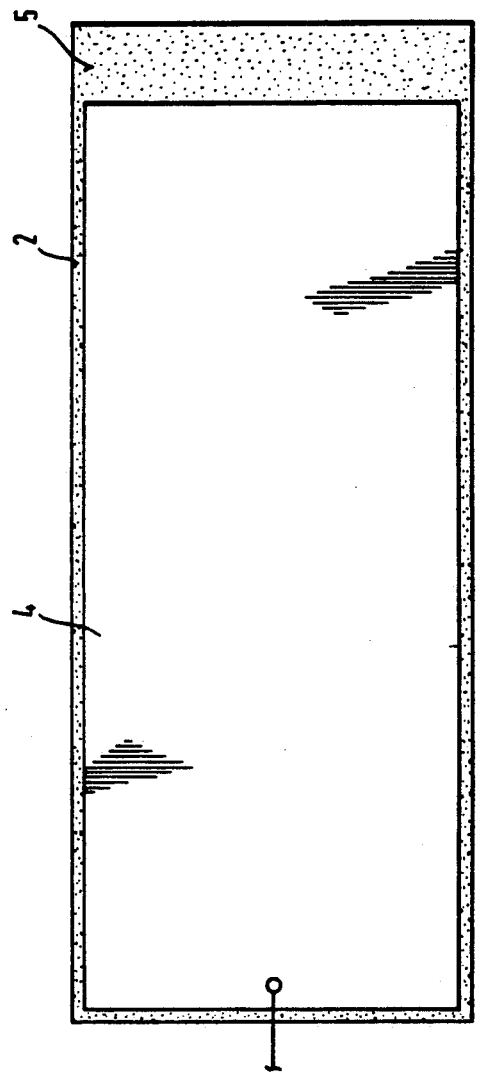

PIEZOELECTRIC BENDING TRANSDUCER AND THE USE THEREOF

DESCRIPTION

The invention relates to a piezoelectric bending transducer which contains at least one ceramic layer which is metallized on both sides and has piezoelectric properties.

German Offenlegungsschrift 3,608,550 has disclosed a valve which can be actuated piezoelectrically and which, in a housing, contains an elongate piezocrystal arrangement which is clamped in on one side and which is connectable to an electric voltage source. The free (mobile) end of the piezocrystal arrangement is provided with a sealing body. On application of a sufficient voltage, the piezocrystal executes a lateral movement. In this way, the sealing body can close a valve channel.

The disadvantage of this design is that the fitting of sealing bodies to the piezocrystal requires an additional working step and increases the mass of the bending transducer, i.e. the natural resonance thereof. The bending transducer therefore loses speed. As a result, a smaller number of switching cycles can be run per unit time. Since the sealing bodies also require space, miniaturization of the valve is made more difficult.

It was therefore the object to indicate a bending element for use in valves, which is designed constructionally in such a way that the indicated disadvantages to the valve manufacturer are avoided.

The invention starts from the recognition of the fact that the piezoceramic layer itself is also suitable for sealing a valve channel if the roughness of the surface is less than 0.5 μm. However, with a conventional metallization of the piezoceramic body, which is necessary for later generation of the field strength, higher roughness values are obtained.

A piezoelectric bending transducer has now been found which, as the essential constituents, comprises
a) at least one piezoelectric ceramic layer which is metallized on both sides and is polarized such that on application of a voltage it undergoes a change in length, and
b) a rigid molding which is joined to the whole surface thereof and has approximately the same surface dimensions and which on application of a voltage does not undergo an elongation or undergoes an opposite elongation.

In the bending transducer, the ceramic layer has an unmetallized area of roughness $R_a$ of less than 0.5 μm on at least one side. This unmetallized area should be located in the zone of maximum deflection when the bending transducer is connected to a voltage source and is suitably clamped in. The unmetallized area should be slightly larger than the valve channel which is to be covered. The metallization of the piezo-layers is usually effected by screen printing. In order to avoid running-down of the printing paste on the edge of the layer or later sparking at the edge, a narrow, approximately 0.3 mm wide strip is usually left unprinted at the edge. Such a strip is insufficient for covering a valve channel. The unmetallized area should have minimum dimensions of 1×1 mm.

The smaller the proportion of the unmetallized area in the total mobile surface, the smaller is the loss of deflection of the bending transducer on application of a fixed voltage. The unmetallized area should therefore be as closely coherent as possible.

The rigid two-dimensional molding can be composed of any desired material, e.g. it can be a metal sheet (no piezoelectric properties) or likewise a ceramic layer which is metallized on both sides and has piezoelectric properties. By means of suitable polarization of the piezo-layers used and observation of the sign of the applied voltage, it is possible to accomplish an elongation of the two layers in opposite directions, which leads to a curvature of the bending transducer, i.e. to a movement approximately perpendicular to the direction of the surface.

The metallized ceramic layer has preferably the shape of an elongate, in most cases rectangular strip. The unmetallized area is then located on a narrow end of the strip. When used in a valve, the strip is clamped in on one side at the other end and supplied with voltage.

Such a strip has in general a length/width ratio from 1:2 to 1:4. The unmetallized area should be of such a size that it covers a rectangle whose length is at least equal to the width and whose width amounts to at least 1 mm or even better at least 2 mm. Preferably, the length/width ratio is in the range from 1:1 to 4:1. For example, a rectangular region of 2.3×7.4 mm or 2×10 mm or a circular area (diameter 1.5×2.5 mm) can be left without metallization on a strip of piezoceramic material having a surface area of 25×10 mm. Circular regions are better for covering round valve orifices. For reasons of production engineering, rectangular regions are easier to produce free of metallization.

It is also possible to provide the ceramic layer having piezoelectric properties with a circular shape and to arrange the unmetallized area approximately in the center of the circle. Such a bending transducer is clamped in at the edge and the region which deflects most strongly on application of a voltage is likewise located in the center of the circle. In a bending transducer which has the shape of an elongate strip, it is also possible to provide metallization-free zones on the uppermost and lowermost ceramic plates of the composite. This makes it possible for one or the other side in a valve to cover a valve channel, depending on the deflection of the strip. This permits the construction of a valve having three valve channels and only one bending transducer.

To produce piezoelectric ceramics (e.g. based on lead zirconate/titanate), the starting materials used are in most cases powders of metal oxides and metal carbonates. The product having the final chemical composition is already obtained by calcination, as the result of a solid-state reaction. Other processes such as, for example, coprecipitation of the dissolved starting raw materials are likewise applied.

After calcination, the powder is in most cases subjected to a second grind in order to reduce the grain diameter. During this grind, liquid and plasticizer are added to the powder, so that a slip is formed. As a rule, the slip is then dried by a spraying process and pressed dry into the desired shape.

To produce thin parts, organic plasticizers and binders are added to the slip. Thin flexible foils are obtained from the slip by foil casting. Parts of the desired shape are punched out of these foils and, after expelling of the organic substances present, are sintered. Afterwards, the parts are provided with metal electrodes.

Piezo-ceramic products of small thickness can also be produced by compressing a piezo-material in block form and sawing it up by means of suitable saws.

After the sinter firing, the ceramic part is in the form of a polycrystalline body with irregularly distributed electric dipoles, i.e. it does not show any piezoelectric activity. It is only by the step of a so-called polarization, i.e. application of a strong electric field, that the dipoles are almost completely oriented.

The orientation is largely retained also after the polarization field has been switched off, and it is associated with a permanent change in the length of the body.

Further details on the production of ceramic piezocrystalline materials are known to those skilled in the art, for example, from Ullman, 3rd edition, Enzyclopädie der Technischen Chemie [Encyclopedia of Industrial Chemistry], volume 11, page 421, and Bauer, Bühling et al., "Technologie und Anwendung von Ferroelektrika [Technology and Application of Ferroelectrics]", Akademische Verlagsgesellschaft, Leipzig.

Since no additional sealing elements are necessary for a valve, the working steps for the involved assembly of the sealing elements are no longer necessary and the constructional shape of the valve can turn out to be very small.

For operation also in the low-voltage range (24 volt), ceramic layer thicknesses of less than 200 μm are chosen. In this case, when a voltage of 24 volt is applied and after the transducer has been clamped in at the metallized end of the strip, such a deflection should take place in the unmetallized area that a valve channel is reliably closed.

When an interlayer of any desired material, preferably a metal sheet, is used, the rigidity of the bender is increased at unchanged ceramic layer thicknesses, since the distance of the ceramic plates from the central neutral zone is enlarged.

As a result, the natural resonance and hence the speed of the transducer are increased, which meets the demand of the user for increasingly fast switching cycles.

For efficient production, both ceramic foils are in general polarized in the same direction in a bender which consists of only two ceramic layers. To achieve the maximum deflection, the bender is activated in such a way that one piezoceramic layer is shortened (the field in the direction of polarization), whereas the other piezoceramic layer is elongated (the field opposite to the direction of polarization). For this purpose, the two outer electrodes of the upper and lower ceramic plates are in actual operation electrically connected to one another and form, for example, the minus terminal, while the central electrode forms the plus pole.

For very low voltages (for example 6 volt), it is also possible adhesively to bond a plurality (x), preferably 2 to 8, of very thin (100 μm and thinner) piezoceramic layers metallized on both sides to one another, using up to (x-1) interlayers of a conductive material, for example interlayers of sheet metal, carbon or a conductive ceramic material. The ceramic bodies are then polarized and electrically conducted in such a way that, in a bender having, for example, 6 active ceramic layers, the upper three layers are elongated, while the lower three layers are shortened, when the supply voltage is applied.

Instead of adhesively bonding a metal sheet to a metallized piezoceramic body or two sintered metallized ceramic foils to one another, it is also possible to provide unsintered piezoceramic raw foils with a suitable electrode material, to laminate them together and then to subject them to sinter firing, a monolithic piezoceramic bender being formed. Since the electrode material must withstand sinter temperatures from 900° C. to 1200° C., without reacting with the metal oxides of the piezoceramic material, only a few materials such as, for example, platinum are suitable for this purpose.

Adhesive bonding of sintered metallized piezoceramic plates by means of an organic adhesive, for example a one-component methacrylate adhesive, is cheaper and simpler with regard to the production process.

BRIEF DESCRIPTION OF THE DRAWINGS

FIG. 1a shows a cross-section of a piezoelectric bending transducer in strip form;

FIG. 1b shows the bending transducer of FIG. 1a in plan view;

FIG. 2a shows a cross-section of a bending transducer in strip form;

FIG. 2b shows the bending transducer of FIG. 2a in plan view;

SUMMARY OF THE INVENTION

Figure 3A:
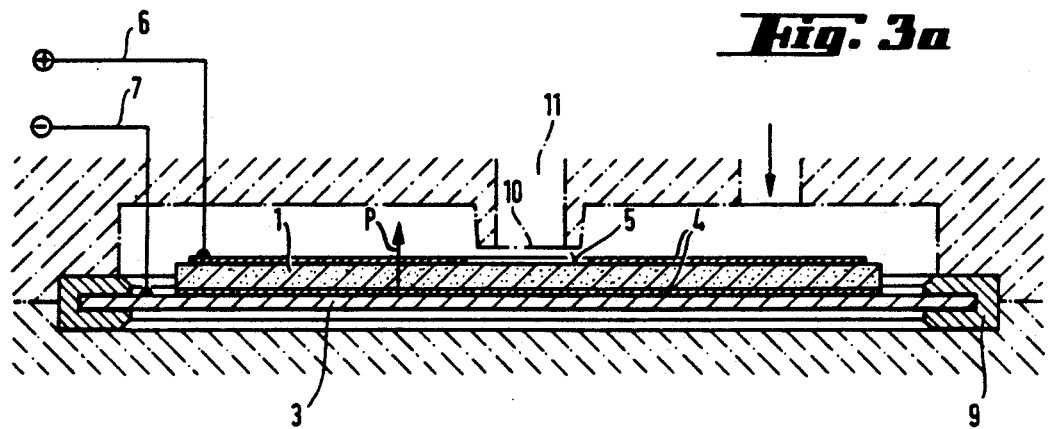
FIG. 3a shows a cross-section of an approximately circular bending element and a valve channel.

The invention is explained in more detail by the figures: FIG. 1a shows a cross-section of a piezoelectric bending transducer in strip form, composed of two ceramic layers (1, 2) metallized on both sides and a conductive interlayer, for example a metal sheet (3). The layers 1 and 2 are each coated on both sides with the thin metallization layer (4). In the figure, a small area (5) is free of metallization on both sides at one end of each strip. This area serves as a sealing face in contact with a valve channel (11). Bending transducers which have an unmetallized area on only one side can also be used (for certain valves). In the layers (1) and (2), the polarization vector P points in the same direction. The two layers (1) and (2) are adhesively bonded to the interlayer (3). The thin adhesive layer is not shown in the drawing. Current is supplied through the wires (6), (7) and (8). At the end carrying the current supply, the bending transducer is later clamped mechanically in the holder (9) and at the same time contacted. The length of the two piezo-layers is not exactly equal, so that it is easier to solder a current lead to the interlayer. It would equally be possible to make the two ceramic layers of equal length and to make the metal sheet (3) somewhat longer. FIG. (1b) shows the same bending transducer in plan view.

FIG. 2a shows a cross-section of a bending transducer in strip form, which is composed of two piezoceramic layers (1, 2) which each carry the metallization layer (4). There is no conductive interlayer. At one end, the metallization layers (4) are connected to the current leads (6, 7). At the opposite end of the strip, a small area (5) of the layer remains without metallization on at least one side. The polarization vector P of the two layers (1, 2) points in opposite directions. FIG. 2b shows the same bending transducer in plan view.

Figure 3B:
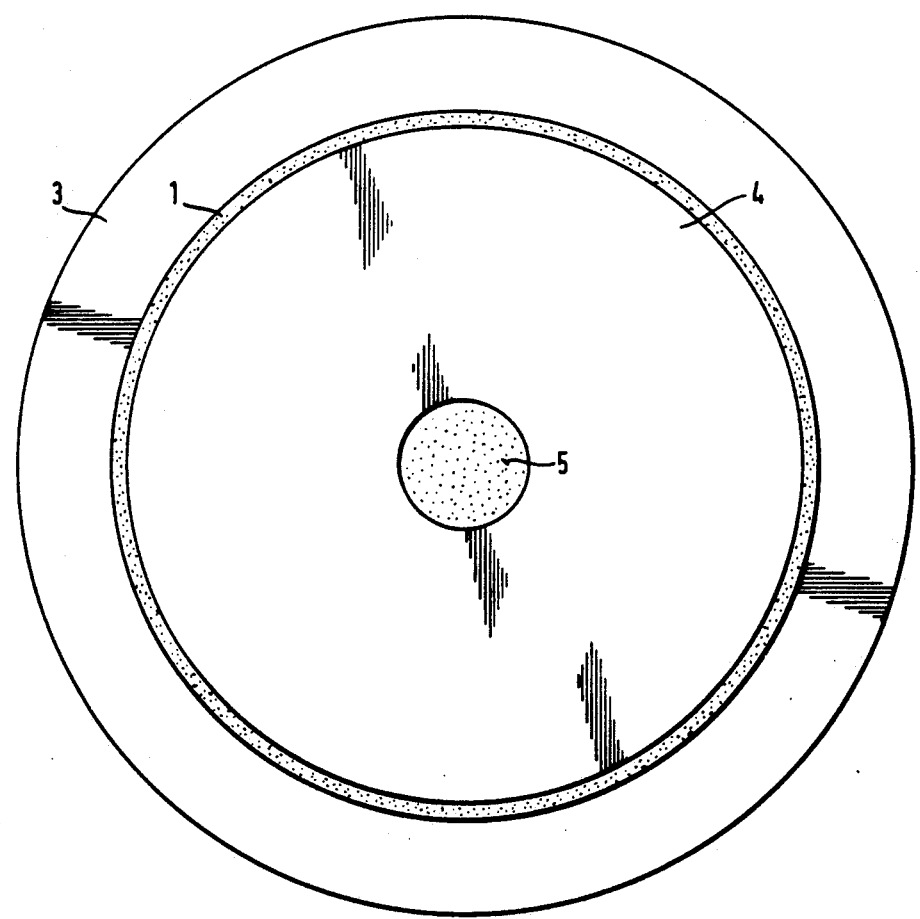
FIG. 3b shows the bending transducer (without clamping) of FIG. 3a in plan view.

FIG. (3a) shows a cross-section of an approximately circular bending element and a valve channel which is to be covered by the bending element. It contains an active piezoceramic layer (1) which has metallization zones (4) on both sides and is adhesively bonded (adhesive not shown in the drawing) to a circular metal sheet (3). At its edge, the metal sheet (3) is mechanically clamped into a conductive circular holder (9). When the metallization zones (4) are electrically activated via the current leads (6) and (7), the composite transducer is deflected. The deflection is greatest in the center of the circular composite transducer. The center is also the location of the metallization-free zone (5) which comes to bear against the orifice (10) of the valve channel (11) and ensures sealing thereof. FIG. 3b shows the same bending transducer (without clamping) in plan view.

We claim:

1. A piezoelectric bending transducer, comprising at least one ceramic layer which is metallized on both first and second sides, has piezoelectric properties and is polarized such that on application on a voltage it undergoes a change in length, and at least one rigid molding which is joined to the whole metallized surface of the first side and has approximately the same surface dimensions as the ceramic layer and which on application of a voltage does not undergo an elongation or undergoes an elongation opposite that of the ceramic layer, wherein the ceramic layer with piezoelectric properties has a non-metallized side portion having a roughness $R_a$ of less than 0.5 μm.

2. The bending transducer as claimed in claim 1, wherein the ceramic layer with piezoelectric properties has a circular shape and the non-metallized portion is located approximately in the center of the circle.

3. The bending transducer as claimed in claim 1, wherein the ceramic layer with piezoelectric properties has the shape of an elongate strip having first and second ends and the non-metallized portion is located at the first end of the strip.

4. The bending transducer as claimed in claim 3, comprising two ceramic layers which are adhesively bonded to one another, each of which is metallized on both sides and have piezoelectric properties and which are polarized in opposite directions and in which the two outer metallizations are connectable to the two poles of an electric voltage source.

5. The bending transducer as claimed in claim 3, comprising two ceramic layers which are adhesively bonded sandwich-like to both sides of a non-conductive molding, both layers having the second end enclosed in the metallized layer and each ceramic layer being connectable to the poles of an electric voltage source.

6. The bending transducer as claimed in claim 3, comprising two ceramic layers which are adhesively bonded sandwich-like to both sides of an electrically conductive two-dimensional molding, both layers being polarized in the same direction, and the conductive molding on the one hand and the two outer metallizations of the ceramic layers on the other hand being connectable to the two poles of an electric voltage source.

7. A bending transducer as claimed in claim 3, wherein the non-metallized portion is in the shape of a rectangle having a length to width ratio ranging from 1:1 to 4:1.

8. A bending transducer as claimed in claim 3, wherein the non-metallized portion is in the shape of a rectangle having a dimension of at least 1 mm×1 mm.

9. The bending transducer as claimed in claim 6, wherein the conductive molding comprises a carbon fiber composite plate having a density of 1.3–1.5 g/cm³.

10. The bending transducer as claimed in claim 6, wherein the conductive molding comprises a metal sheet.

11. An electrically actuated valve for pressurized gases which includes a control element comprising a bending transducer according to claim 1.

12. A bending transducer as claimed in claim 1, wherein the ceramic layer with piezoelectric properties is prepared by grinding a piezoelectric ceramic powder in the presence of liquid and plasticizer to form a slip, adding binder to the slip, preparing flexible foils from the slip by foil casting, forming from the foil an article having a predetermined shape, removing from the article organic substances and then sintering the article to produce the ceramic layer.

13. A bending transducer as claimed in claim 1, wherein the rigid molding comprises a ceramic layer having piezoelectric characteristics and first and second surfaces each having disposed thereon a metallized layer.

14. A bending transducer as claimed in claim 1, wherein the non-metallized portion is located in a zone of maximum deflection of the bending transducer when subjected to an electric voltage.

15. A piezoelectric bending transducer, comprising:
at least one ceramic layer having a first surface, a second surface and piezoelectric characteristics and which is polarized such that when subjected to a voltage it undergoes a change in length;
a first metallized layer applied over a portion of the first surface;
a second metallized layer applied over the entire second surface; and,
at least one rigid molding joined to the second metallized layer so that it is at least co-extensive with the second metallized layer and which when subjected to a voltage does not undergo an elongation or undergoes an elongation opposite that of the ceramic layer;
wherein the non-metallized portion of the first surface exhibits a roughness $R_a$ of less than 0.5 μm.

16. A bending transducer as claimed in claim 15, wherein the rigid molding comprises a second ceramic layer presenting:
a first surface having disposed over its entire area a first metallized layer, wherein the first metallized layer of the second ceramic layer joins the second metallized layer of the first ceramic layer; and
a second surface having a metallized layer disposed on a portion thereof, wherein the non-metallized portion of the second surface exhibits a roughness $R_a$ of less than 0.5 μm;
wherein the second ceramic layer has piezoelectric characteristics and is polarized in a direction opposite that of the first ceramic layer.

17. A bending transducer as claimed in claim 15, wherein the rigid molding is disposed between two ceramic layers such that the non-metallized surface portions of each ceramic layer are located on the outside of the transducer and face away from the rigid molding.

18. A bending transducer as claimed in claim 15, wherein the rigid molding comprises a ceramic layer having piezoelectric characteristics and first and second surfaces each having disposed thereon a metallized layer.

19. A bending transducer as claimed in claim 15, wherein the non-metallized portion is located in a zone of maximum deflection of the bending transducer when subjected to an electric voltage.

20. A valve which can be actuated piezoelectrically and includes a housing with two valve channels, comprising
   a) a piezoelectric bending transducer as claimed in claim 1, which is clamped in on one side in the interior of the housing and has terminals for connection to an electric voltage source and which is arranged in such a way that, in the absence of electric voltage, the non-metallized portion of the ceramic layer touches and closes the first valve channel and on application of a voltage unblocks this valve channel, and
   b) a second valve channel through which pressurized gas can pass into the interior of the housing.

21. A valve which can be actuated piezoelectrically, comprising:

a housing having an interior chamber and first and second valve channels, the second valve channel communicated with the interior chamber so as to allow pressurized gas to pass into the interior chamber;

a bending transducer according to claim 15 arranged within the interior chamber;

means for clamping one end of the bending transducer to the housing; and terminals for connection to an electric voltage source;

wherein the non-metallized surface portion of the ceramic layer contacts and seals a first valve channel in the absence of electric voltage but upon application of a voltage disengages from and opens the first valve channel.

* * * * *